(12) United States Patent
Fackelmeier et al.

(10) Patent No.: US 12,399,240 B2
(45) Date of Patent: Aug. 26, 2025

(54) LOCAL COIL FOR A MAGNETIC RESONANCE TOMOGRAPHY SYSTEM AND A MAGNETIC RESONANCE TOMOGRAPHY SYSTEM

(71) Applicant: Siemens Healthcare GmbH, Erlangen (DE)

(72) Inventors: Andreas Fackelmeier, Thalmässing (DE); Stephan Zink, Bayern (DE); Klaus Huber, Effeltrich (DE); Robert Rehner, Neunkirchen am Brand (DE)

(73) Assignee: Siemens Healthineers AG, Forchheim (DE)

( * ) Notice: Subject to any disclaimer, the term of this patent is extended or adjusted under 35 U.S.C. 154(b) by 203 days.

(21) Appl. No.: 18/232,507

(22) Filed: Aug. 10, 2023

(65) Prior Publication Data
US 2024/0053417 A1    Feb. 15, 2024

(30) Foreign Application Priority Data
Aug. 10, 2022   (EP) ..................... 22189767

(51) Int. Cl.
*G01R 33/34*   (2006.01)
(52) U.S. Cl.
CPC .................... *G01R 33/34* (2013.01)
(58) Field of Classification Search
CPC .. G01R 33/34; G01R 33/36; G01R 33/34084; G01R 33/3415; G01R 33/3692; G01R 33/288; G01R 33/3403; G01R 33/48
See application file for complete search history.

(56) References Cited

U.S. PATENT DOCUMENTS

| 2007/0188175 | A1  | 8/2007  | Burdick et al. |
| 2007/0262777 | A1  | 11/2007 | Warntjes |
| 2008/0238424 | A1  | 10/2008 | Possanzini |
| 2008/0284435 | A1  | 11/2008 | Overweg |
| 2015/0028868 | A1* | 1/2015  | Candidus ........... G01R 33/3403 324/322 |
| 2021/0025952 | A1  | 1/2021  | Fackelmeier et al. |
| 2022/0043083 | A1* | 2/2022  | Lyu ................... G01R 33/3403 |

FOREIGN PATENT DOCUMENTS

| DE | 102007007623 A1 | 8/2007 |
| DE | 102020208232 A1 | 1/2021 |
| WO | 2005052621 A1   | 6/2005 |

OTHER PUBLICATIONS

Dr. Andreas Fackelmeier, et al. "Power supply for a wireless MRT local coil" Siemens, 2021, with English translation. pp. 1-8.

* cited by examiner

*Primary Examiner* — G. M. A Hyder
(74) *Attorney, Agent, or Firm* — Lempia Summerfield Katz LLC

(57) ABSTRACT

A local coil for a magnetic resonance tomography system is provided. The local coil has a plate-shaped local coil body with a main extension plane, and an electronic apparatus within the local coil body. A wireless local coil generates waste heat. Therefore, the local coil has an electrically non-conducting heat sink body that is connected for the conduction of heat to the electronic apparatus, and is configured as a type of plate within the local coil body in order to distribute heat of the electronic apparatus in the main extension plane of the local coil body. This provides that a surface of the local coil has a standards-compliant temperature.

19 Claims, 3 Drawing Sheets

LOCAL COIL FOR A MAGNETIC RESONANCE TOMOGRAPHY SYSTEM AND A MAGNETIC RESONANCE TOMOGRAPHY SYSTEM

This application claims the benefit of European Patent Application No. EP 22189767.1, filed on Aug. 10, 2022, which is hereby incorporated by reference in its entirety.

BACKGROUND

The present embodiments relate to a local coil (LC) for a magnetic resonance tomography system (MRT system), as well as to an associated MRT system.

MRT systems are imaging apparatuses that, for imaging an examination object, align nuclear spins of the examination object with a strong external magnetic field, and through a magnetic alternating field, excite the nuclear spins to precession about this alignment. The precession or return of the spins from this excited state into a state with lower energy creates, as a response, a magnetic alternating field, also referred to as a magnetic resonance signal, which is received via antennas.

With the aid of magnetic gradient fields, a spatial encoding is impressed on the signals, which subsequently makes it possible to assign the received signal to a volume element. The received signal is then evaluated, and a three-dimensional imaging representation of the examination object is provided. The representation created specifies a spatial density distribution of the spins.

In order to improve the signal-to-noise ratio and also, by parallel sampling, to speed up the image acquisition, as many receive antennas as possible in the form of an antenna matrix referred to as a local coil matrix are increasingly being arranged as close as possible to the body of the patient, which are arranged in what is known as a local coil (LC). To transmit the signals received in the LC or local coil matrix, a cable connection may be used. In this case, however, the cables also act as antennas during the excitation pulse, so that specific safety measures such as baluns are to be provided in order not to endanger the patient. Handling the cables is also awkward.

At present, a wireless transmission of image and control signals between the MRT system and the LC is therefore being considered. The electrical components in the LC used for this need much more electrical power than those for LCs connected by wire, which results in a much higher generation of heat, which is to be dissipated.

For a future wireless LC, a very wide range of digital methods are being considered, in which digital chips, such as, for example, ADC, FPGAs, and transceiver ICs are used. A point-type heat hotspot arises here, however, since the digital chips are to be placed close enough to each other for the MR receipt of the LC not to be disturbed by noise signals of longer digital signal/bus lines. Set against this, however, is the fact that in medical devices, the surface temperature of touchable surfaces may not exceed 41° C. This is defined as mandatory in corresponding standards. There is, however, no suitable solution for a wireless LC that can fulfill the corresponding standards.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a local coil of which a surface has a standards-compliant temperature during operation is provided.

A local coil for a magnetic resonance tomography system that has a plate-shaped local coil body with a main extension plane and an electronic apparatus within the local coil body is provided by a first aspect of the present embodiments. In accordance with the present embodiments, the local coil has an electrically non-conducting heat sink body that is connected for conduction of heat to the electronic apparatus and is configured in the shape of a plate within the local coil body in order to distribute heat of the electronic apparatus in the main extension plane of the local coil body.

The local coil (LC) may, for example, involve a wireless LC. This is to be understood as the LC being able to communicate wirelessly with an external apparatus of the MRT system. For example, image signals and/or control signals may be transmitted via a bidirectional, wireless communication link between the LC and the external apparatus. For example, this may involve a digital communication link.

The LC or a body of the LC, referred to here as the local coil body, is configured in the shape of a plate. For example, this provides that an extent at right angles to the virtual main extension plane is significantly smaller than extents in parallel to the main extension plane. The plate-shaped body may have raised sections, bulges, or the like, in which, for example, components of the LC may be accommodated. The local coil body, and thus also the main extension plane, may be corrugated, as well as having rounded sections, waves, or the like. For example, the LC may be able to be adapted to a shape of limbs, torso, or head of a person or an animal.

The electronic apparatus is arranged in an interior of the local coil body. This may be concentrated locally in the local coil body. The local concentration of the electronic apparatus provides that heat may arise in operation, which may lead to a high temperature.

For example, the electronic apparatus may have a printed circuit board to which a number of electronic components may be attached and electrically connected. For example, the electronic apparatus has an electronic communication facility for wireless and digital communication with the external apparatus. Further, the electronic apparatus may have an Analog Digital Converter (ADC), Integrated Circuit (IC) (e.g., an FPGA (Field Programmable Gate Array)), or a Transceiver IC or the like for this purpose. The electronic apparatus may have a control unit, a processing unit, and energy store or the like.

The heat sink body is an electrical non-conductor or an electrical insulator. For example, there may be provision for the heat sink body to be absolutely non-magnetic and not able to be magnetized. In one embodiment, the heat sink body may consist of a heat-conducting plastic, where the material or the particles that are introduced into the plastic are electrically non-conducting and non-magnetic. The heat sink body may be embodied rigid or deformable.

The heat sink body is connected for heat conduction (e.g., in contact with the electronic apparatus), so that, for example, heat may be dissipated by heat conduction from the electronic apparatus via the heat sink body. The result of this is that a temperature at the surface of the local coil in an area of the electronic apparatus does not exceed a predetermined limit value.

The heat sink body is configured in a plate shape within the plate-shaped local coil body (e.g., in the main extension plane of the local coil body).

For example, this provides that an extent of the heat sink body at right angles to the virtual main extension plane is significantly smaller than extents parallel to the main extension plane. What can be achieved by this is that the heat of the electronic apparatus is essentially distributed in the main extension plane of the local coil body. As a result, the temperature of the surface of the local coil (e.g., on an upper side and a lower side of the local coil) in the area of the electronic apparatus may be kept below a predetermined limit value.

For example, the heat sink body may be configured within a section of the local coil body or essentially within the local coil body as a whole.

The advantage produced by the present embodiments is that a temperature on the surface, specifically in the area of the electronic apparatus, does not exceed the limit temperature (e.g., 41° C.) in operation. The present embodiments, specifically by the optimized shape of the heat sink body, enables the heat in the main extension plane to be distributed so that a temperature distribution on the surface of the local coil is even.

The present embodiments also include forms of embodiment by which additional advantages are produced.

One form of embodiment makes provision for the electronic apparatus to be enclosed by the heat sink body. The heat sink body may completely enclose the electronic apparatus. Enclosed may be understood as the heat sink body enclosing the electronic apparatus being in contact with the heat sink body. This has the advantage that the heat from the electronic apparatus may only be conveyed into the heat sink body. Thus, the heat may be better distributed and does not penetrate onto the surface in other ways.

One form of embodiment makes provision for the electronic apparatus, viewed in the main extension plane, to be arranged in the middle of the heat sink body. The middle may, for example, be a surface or a space around a geometrical midpoint of the heat sink body in the main extension plane.

An arrangement of the electronic apparatus in the extension at right angles to the main extension plane is not restricted by the arrangement in the middle. In one embodiment, the electronic apparatus, viewed at right angles to the main extension plane, may be arranged in a center of the heat sink body. The center may, for example, be a surface or a space around a geometrical center of the heat sink body at right angles to the main extension plane. As an alternative, the heat sink body may be arranged offset from the center.

The arrangement in the middle has the advantage that the heat may be distributed evenly. For example, the heat is thus distributed equally in opposing directions in the main extension plane.

One form of embodiment makes provision for the heat sink body to be embodied in a disk shape in the main extension plane. In one embodiment, a height of the heat sink body at right angles to the main extension plane reduces outwards from the middle.

For example, in the area of the electronic apparatus, the height of the heat sink body may initially be constant and only then reduce to the outside. The heat sink body is embodied quasi tapering towards the outside.

The shape of the heat sink body may thereby be shaped for an optimum flow of heat in the main extension plane. This enables the heat to be evenly distributed in the plane. For example, a falling temperature gradient may be formed at right angles to the main extension plane, so that the heat may radiate out over the entire surface of the LC.

One form of embodiment makes provision for the local coil to have a heat insulation layer that encloses the heat sink body at least partly.

For example, the heat insulation layer may be embodied on the upper side and/or the lower side on the LC. For example, the heat sink body may be embodied completely in the heat insulation layer. The heat insulation layer completely envelopes the heat sink body. It may thus be provided that the temperature on the surface does not climb above the predetermined temperature limit value. For example, the heat insulation layer may be embodied equal in thickness. In one embodiment, the heat insulation layer may be just thick enough for the temperature at the surface to be evenly distributed and to lie below the temperature limit value.

For example, the heat insulation layer is electrically non-conducting and not magnetizable. In one embodiment, the heat insulation layer has no influence on the MRT. For example, the heat insulation layer includes an insulating material.

One form of embodiment makes provision for a thickness of the heat insulation layer at right angles to the main extension plane to reduce outwards from the middle of the heat sink body.

The thickness is consequently defined in a vertical direction relative to the main extension plane. In the middle of the heat sink body, in which the electronic apparatus may be found, the thickness of the heat insulation layer may be embodied thicker by comparison. This has the advantage that in the area in which the heat is formed, the surface of the LC at right angles to the main extension plane is shielded the most. Through this, the heat flow is practically conveyed along the main extension plane and evenly distributed in the plane. In one embodiment, an even temperature distribution on the surface of the LC below the temperature limit value may be achieved by this.

One form of embodiment makes provision for the heat sink body to be thicker below the electronic apparatus than it is above the electronic apparatus. For example, a proportion of the heat sink body oriented towards the lower side is thicker than the proportion oriented towards the upper side.

In one embodiment, the lower side may be intended for contact with the body of a person, while the upper side may be surrounded by air. Through the asymmetrical distribution of the heat sink body, viewed at right angles to the main extension plane, the heat may thus be directed explicitly to the upper side, so that the heat may radiate over the surface of the upper side and/or transfer convectively into the air. This has the advantage that the heat does not build up on the lower side, and thus, an elevated temperature cannot arise on the surface of the lower side, which may be in contact with the body of the person.

In one embodiment, the insulation layer may be thicker on the lower side, so that a heat flow through the surface to the lower side is reduced compared to the upper side. This enables an overheating of the lower side to be suppressed.

One form of embodiment makes provision for the heat sink body to have a hinge, which is configured to adjust an angle in the heat sink body.

The LC may be configured so that the LC may adapt to a body shape of the person or make a snug fit with the body shape (e.g., a torso, an arm, a head, or the like). To do this, the local coil body is to be configured flexibly in order for its shape to be able to be adapted. It is precisely through a rigid heat sink body that this flexibility may be reduced with an increasing size of the heat sink body. In order to still provide the flexibility of the LC, the heat sink body has the hinge, at least one hinge, or a number of hinges.

Using the hinge, the angle in the main extension plane in the heat sink body, and thus in the LC, may be adapted or set. Thus, the LC may be adapted to the body of the person.

One form of embodiment makes provision for the hinge to have a latching apparatus, which is configured to define the angle.

For example, the hinge may be latched or fixed in steps or steplessly by the latching apparatus. This enables it to be provided that a shape of the flexible LC may be fixed and thus does not change during operation.

One form of embodiment makes provision for the heat sink body to be deformable. For example, a material of the heat sink body may be deformable. For example, the heat sink body may be able to be deformed under normal conditions (e.g., at room temperature).

Deformable may be the heat sink body being flexible like rubber. For example, the heat sink body may be elastically deformable up to a limit. Beyond this, the heat sink body may be plastically deformable. For example, the heat sink body may feature a deformable plastic (e.g., a compound made of thermoplastic elastomers (TPE)).

One form of embodiment makes provision for the local coil body to have at least two sections connected movably to one another. For example, a plurality of sections of the local coil body may be connected movably to one another and essentially be embodied next to one another in the main extension plane. For example, an electronic apparatus and/or a heat sink body may be embodied in each case in each of the sections, so that the LC may include at least two electronic apparatuses and/or at least two heat sink bodies.

In one embodiment, the heat sink body is embodied over a number of sections. For example, the heat sink body has the hinges for this purpose and/or is configured deformably, so that a mobility between the sections may be provided. For example, one heat sink body may accept the heat from a number, one per section in each case, of electronic apparatuses and distribute it in the main extension plane.

One form of embodiment makes provision for the electronic apparatus to have a housing, where within the housing, the electronic apparatus has a circuit board with an electronic component.

For example, the electronic components are concentrated on the circuit board in the housing, so that a magnetic interaction with the MRT system is reduced. The electronic components, for example, have the ADC, ICs, the control unit, the processing unit, an energy store, or the like. Air may be enclosed within the housing, which distributes the heat evenly in the housing.

The housing may be made of a heat-conducting, electrically non-conductive material and thereby advantageously dissipate the heat of the electronic apparatus to the heat sink body. In one embodiment, the housing may be enclosed at least in part or completely by the heat sink body. Using the housing, the heat may thus be dissipated to the heat sink body.

One form of embodiment makes provision for the housing to be glued to the heat sink body. For example, the housing is glued to the heat sink body by a layer of glue between the housing and the heat sink body. For example, such a connection may be advantageous between the housing and a rigid heat sink body. The layer of glue may, for example, be especially heat-conducting, such as, for example, a heat-conducting paste. This enables it to be provided that the flow of heat from the housing to the heat sink body is especially effective.

One form of embodiment makes provision for the housing to be connected to the heat sink body by a clamp connection.

For example, the housing may be rigid, and the heat sink body may be flexible like rubber, so that a glue connection may not offer a lasting hold. For example, a mechanical connection embodied as a clamp connection may be advantageous for this purpose. The clamp connection includes, for example, electrically non-conducting components.

For example, the clamp connection may have a first plate and a second plate. The movable plate-shaped heat sink body may be located between the first plate and the second plate. The plates almost enclose the heat sink body like a sandwich, on the upper side and the lower side.

The first plate may be permanently connected to the housing (e.g., screwed to the housing) or may be part of the housing. The second plate may, for example, be permanently connected to the first plate by one or more spacers (e.g., screwed to the first plate). The spacers may, for example, embody a space at right angles to the main extension plane, where the heat sink body may be clamped or pressed within the space. Such a connection has the advantage that even with a movable heat sink body, a fixed and permanent connection is provided.

A magnetic resonance tomography system (MRT system) is provided by a second aspect of the present embodiments. The MRT system includes at least the local coil of the present embodiments.

DETAILED DESCRIPTION

Figure 1:
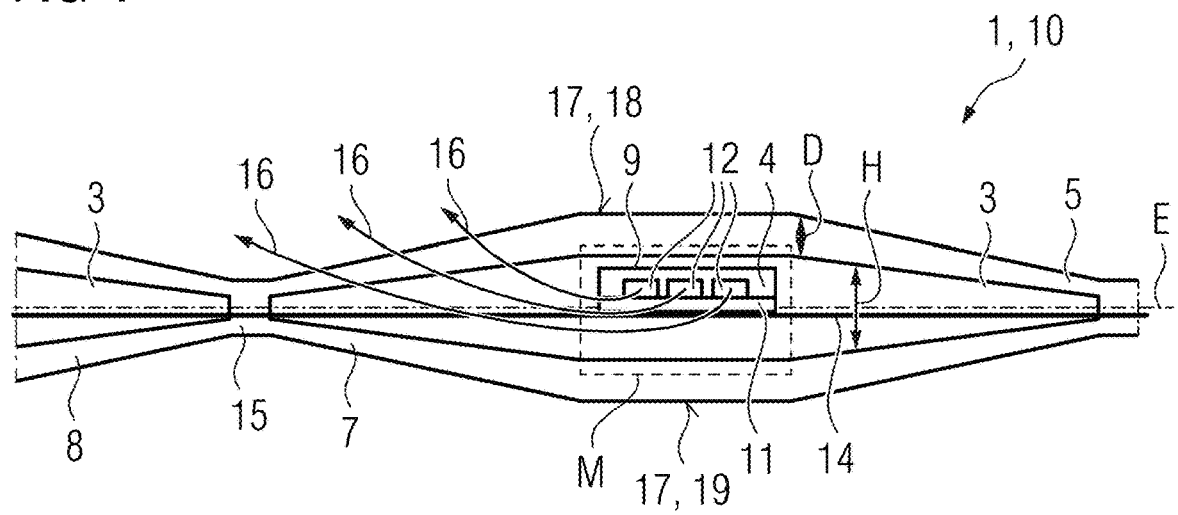
FIG. 1 shows a schematic diagram of a section of an embodiment of a local coil.

In an embodiment, components of a form of embodiment described each represent individual features of the present embodiments to be considered independently of one another, which also each develop the present embodiments independently of one another and thus are also to be seen, individually or in a combination other than that shown, as a component of the present embodiments.

The form of embodiment described is also able to be supplemented by further features of the present embodiments already described. In the figures, the same reference characters refer to elements with the same function in each case.

FIG. 1 is a schematic diagram of a section of an embodiment of a local coil (LC) 1. The LC 1 has a plate-shaped local coil body 10 with a main extension plane E, as well as an electronic apparatus 4 within the local coil body 10. In accordance with the present embodiments, the LC 1 has an electrically non-conducting heat sink body 3 that is connected for conduction of heat to the electronic apparatus 4 and is configured in the shape of a plate within the local coil body 10 in order to distribute heat of the electronic apparatus 4 in the main extension plane E of the local coil body 10.

The electronic apparatus 4 may have a housing 9 that encloses a circuit board 11 and also electronic components 12 in a compact design. In one embodiment, the electronic apparatus 4 or the electronic components 12 are installed in a compact design in a unit, so that there is no disturbance of the magnetic resonance (MR) receipt of the LC 1 by noise signals from longer digital signal/bus lines between the components 12 or on the circuit board 11.

For example, the electronic apparatus 4 may have electronic components 12 for wireless connection with an MRT system 2 such as, for example, an ADC, FPGAs, and transceiver ICs. By comparison with wired LCs, such components 12 need a far higher power (e.g., by around a factor of 10, such as a power increase from 0.5 watts to 5 watts). This increased power will be converted into heat for the most part, so that a temperature of the electronic apparatus 4 rises in active operation. The circuit board 11 may, for example, be connected for signaling to a coil section 14 of the LC 1, by which MR signals may be received. The received MR signal may accordingly be processed by the electronic apparatus 4 and sent wirelessly to the MRT system 2. For example, the LC 1 may have a plurality of coil sections 14 that extend essentially in parallel to the main extension plane E.

In the example shown, the electronic apparatus 4 (e.g., the housing 9) is fully enclosed by the heat sink body 3, so that the housing 9 is located inside the heat sink body 3. The housing 9 is, for example, not magnetic or not able to be magnetized but is made of a heat-conducting material. The housing 9 may be connected for heat conduction to the heat sink body 3, so that a flow of heat 16 of the generated heat of the electronic apparatus may be dissipated especially well. The housing 9 may be glued to the heat sink body 3, for example.

The heat sink body 3 is, for example, not magnetic or not able to be magnetized in order not to disturb the MR signal. For example, the heat sink body 3 includes a heat-conductive plastic (e.g., without metallic particles). The heat sink body 3 may be configured rigid or deformable.

The heat sink body 3 may be configured in a first, plate-shaped section 7 of the LC 1 in the form of a plate. In a second, plate-shaped section 8, a further heat sink body 3 may be configured, within which a further electronic apparatus may be enclosed. The first section 7 and the second section 8 may, for example, be connected movably to one another via a flexible connection 15, so that the LC 1 may make a flexible snug fit with a human body.

For example, the electronic apparatus 4 may be arranged in the middle M of the heat sink body. The middle M may, for example, be understood as a middle area in the main extension plane E. The flow of heat 16 may thus propagate optimally in all directions in the main extension plane E.

The heat sink body 3, for example, has a height H that extends at right angles to the main extension plane E. The height H is, for example, essentially embodied smaller than dimensions of the heat sink body 3 in the main extension plane E. The height H may, for example, be variable in a course along the main extension plane E. In one embodiment, the height H reduces outwards from the middle M, so that the heat sink body 3 may be embodied in a disk shape. In the middle M, in which the electronic apparatus 4 may be embodied, the height H may essentially be constant.

The specific form of the heat sink body 3 in accordance with this embodiment enables the flow of heat 16 to be distributed especially well in the main extension plane E. The arrows, which show the flow of heat 16, are merely shown schematically here. The heat may be distributed, for example, over the entire heat sink body 3. For example, the heat sink body 3 may be embodied higher in the middle M, so that a greater flow of heat 16 is made possible. From the middle M outwards the height H becomes ever smaller, since the flow of heat 16 is also reduced by heat reduction over a surface 17 of the LC 1. For example, the heat may be radiated out and/or dissipated to the environment via the surface 17.

Through the favorable, even distribution of the heat in the heat sink body 3, a temperature on the surface 17 may be evenly distributed. For example, what may be achieved by the LC 1 of the present embodiments is that the temperature on the surface 17 (e.g., concentrated at a temperature hot spot in the middle M) does not exceed a predetermined temperature limit value.

The effect of the even distribution of the heat may, for example, be assisted by a heat insulation layer 5 of the LC 1, which encloses the heat sink body 3 at least in part (e.g., on the lower side and/or the upper side). The heat insulation layer 5 may, for example, include a heat-insulating foam material.

In one embodiment, the heat insulation layer 5 may be configured in the middle M, so that the flow of heat is promoted along the main extension plane. What can be achieved by this is that the temperature in the middle M (e.g., where the heat arises) remains below the temperature limit value on the surface.

In one embodiment, the heat insulation layer 5 may fully enclose the heat sink body 3. For example, the heat insulation layer 5 may have a variable thickness D at right angles to the main extension plane E along the main extension plane E. In one embodiment, the thickness D may reduce outwards from the middle M of the heat sink body 3 so that the effect of the heat distribution in the main extension plane E is further promoted.

For example, a lower side 18 of the LC 1 (e.g., the surface 17 of the lower side 18) may be configured to be in contact with the human body during operation. For example, an upper side 19 of the LC 1 (e.g., the surface 17 of the upper side 19) may be provided to be surrounded by air during operation. Consequently, it may be desirable for the heat sink body to be embodied higher on the upper side 19 than on the lower side 18 so that the heat may be directed to the upper side 19. The heat is thus conveyed away from the human body to the surrounding air, so that the heat does not build up on the human body but may be taken away by way of the surrounding air. This effect may, for example, be assisted by the insulation layer 5 being embodied thicker on the lower side 18 than on the upper side 19.

Figure 2:
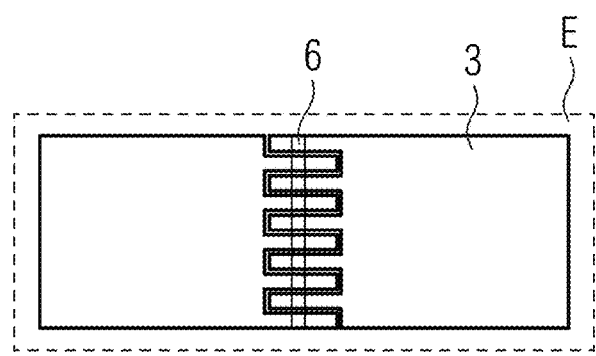
FIG. 2 shows a schematic diagram of a section of a heat sink body with a hinge.

FIG. 2 shows a schematic diagram of a section of the heat sink body 3 with a hinge 6. Using the hinge 6, for example, an angle α may be set in the main extension plane E. An adjustment axis of the hinge 6 correspondingly may run in the main extension plane E. The hinge 6 may, for example, be made of the same material as the heat sink body 6 and thus promote the conduction of heat.

Figure 3:
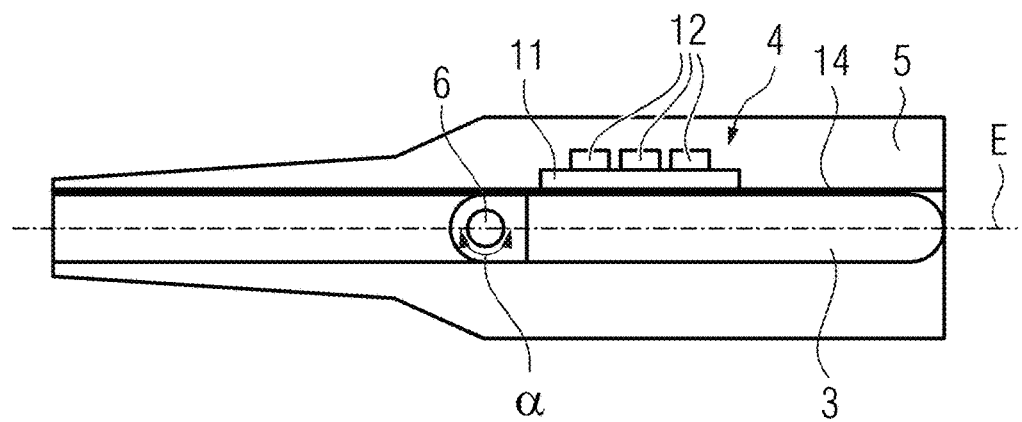
FIG. 3 shows a schematic diagram of a section of an embodiment of a local coil in a straight state.

Shown in FIG. 3 is a schematic diagram of a section of the LC 1, where the heat sink body 3 shows the hinge 6 in a straight state. The angle α may, for example, correspond exactly or roughly to around 180°. For example, the angle α may be fixed via a latching apparatus (not shown) in steps or steplessly, for example.

In the example shown, the electronic apparatus 4 may be arranged on the heat sink body 3. For example, the electronic apparatus 4 may be enclosed by the heat insulation layer 5, so that the heat is merely conveyed on one side from the electronic apparatus 4 into the heat sink body 3.

Figure 4:
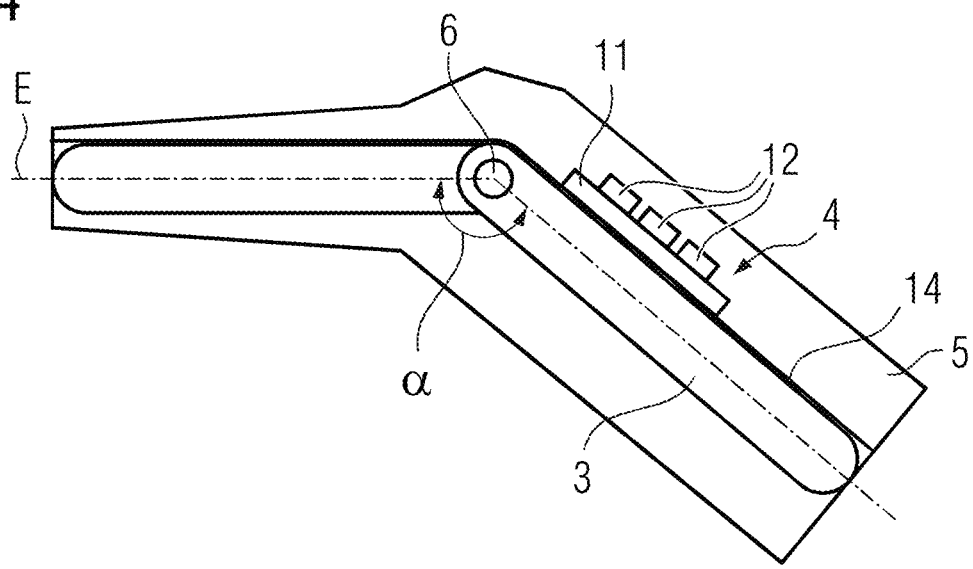
FIG. 4 shows a schematic diagram of a section of an embodiment of a local coil in an angled state.

FIG. 4 shows a schematic diagram of a section of the LC 1, where the heat sink body 3 shows the hinge 6 in an angled state. For example, the angle α corresponds to an angle of around 140°, so that the LC 1 may, for example, be laid on a torso or the like.

Figure 5:
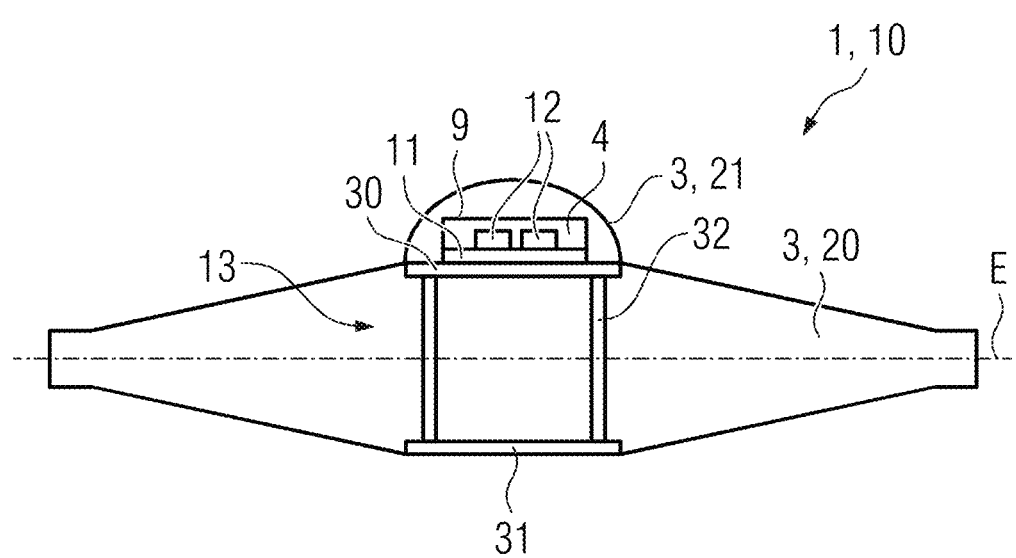
FIG. 5 shows a schematic diagram of a section of an embodiment of a local coil.

Shown in FIG. 5 is a schematic diagram of one of the LCs 1, where, for example, a heat sink body 3 includes a movable plastic 20 and a heat sink body 3 includes a rigid plastic 21. The movable plastic 20 may, for example, be understood as a rubber-like plastic, and/or an elastic and/or plastically deformable plastic (e.g., a compound made from thermoplastic elastomers (TPE)). In the example shown, the rigid plastic 21 encloses the housing 9 of the electronic apparatus 4. For connection of the rigid plastic 21 with the movable plastic 20, a clamp connection 13 may be provided.

The clamp connection 13 may have a first plate 30 and a second plate 31. The movable, plate-shaped heat sink body 3, 20 may be located between the first plate 30 and the second plate 31, for example. The plates 30, 31 practically enclose the heat sink body 3, 20 in a type of sandwich, on the upper side and the lower side.

The first plate 30 may be permanently connected to the rigid plastic 21 (e.g., glued or screwed to the rigid plastic 21). The second plate 31 may, for example, be permanently connected via one or more spacers 32 to the first plate 30 (e.g., screwed to the first plate 30). The spacers 32 may, for example, form a space at right angles to the main extension plane E, where the heat sink body 3, 20 may be clamped or pressed into the space. Such a connection has the advantage that even with a movable heat sink body 3, 20 a fixed and durable is provided.

Figure 6:
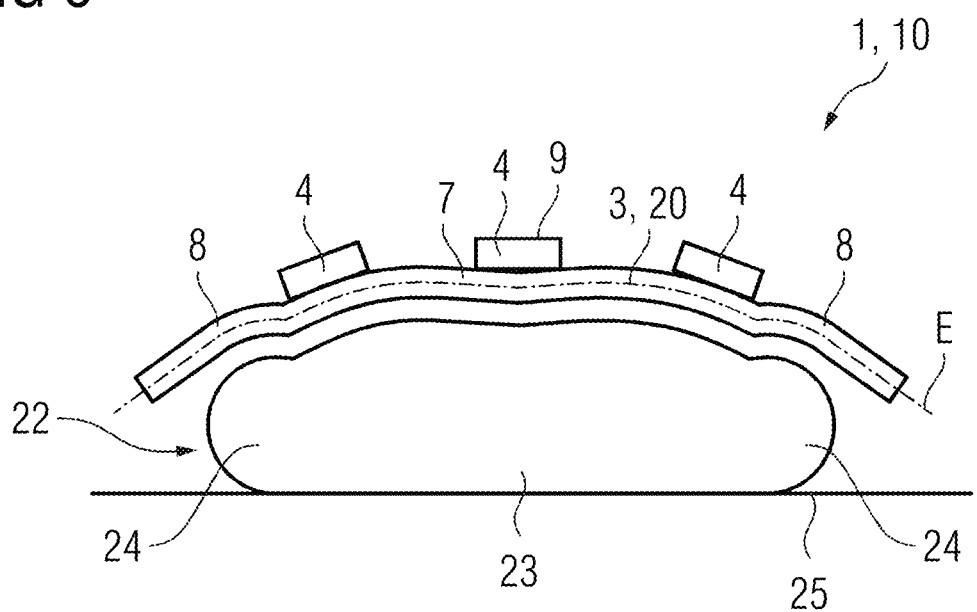
FIG. 6 shows a schematic diagram of a section of an embodiment of a local coil on a body of a person.

Shown in FIG. 6 is a schematic diagram of a section of an LC 1 on a body of a patient 22. For example, the LC 1 rests against a torso 23 and against two arms 24 of the patient 22, where the patient 22 lies on a patient couch 25. The heat sink body 3 made of movable plastic 20 may extend, for example, along the main extension plane E and over a number of sections 7, 8 of the local coil body 10 of the LC 1. The local coil body 10 may, for example, because of the movable heat sink bodies 3, 20, be embodied to fit snugly against the patient 22.

For example, each of the sections 7, 8 has an electronic apparatus 4 with a housing 9 that, for example, is connected by the clamping apparatus 13 (not shown) to the heat sink body 3, 20.

Figure 7:
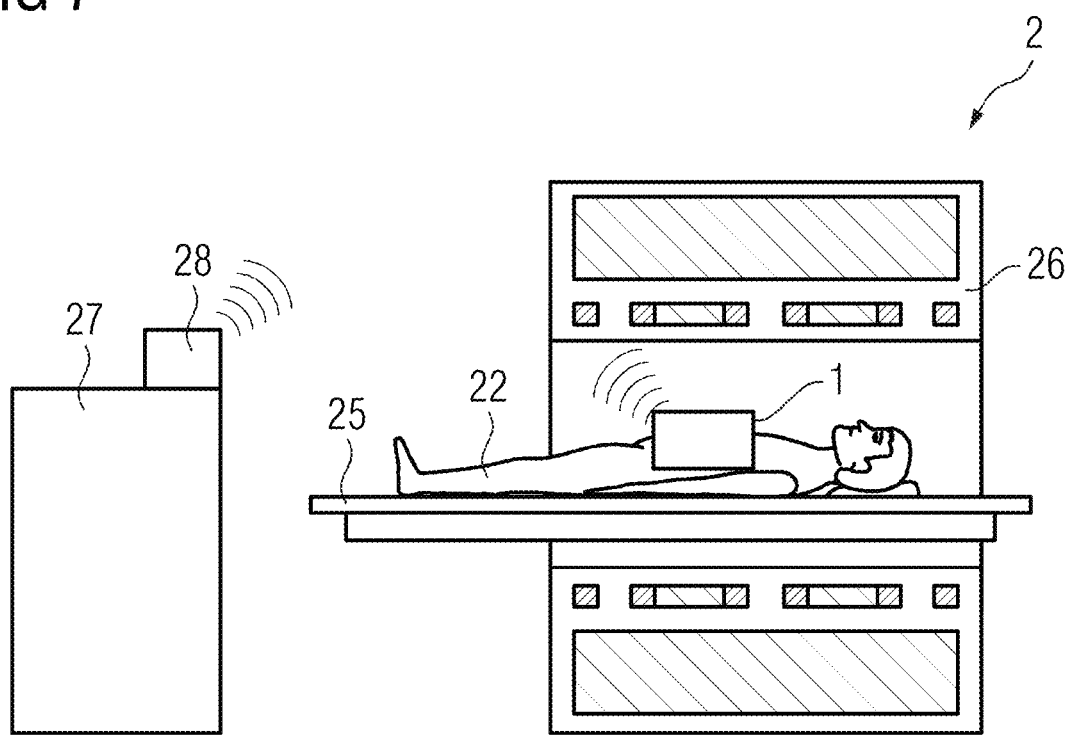
FIG. 7 shows a schematic diagram of an embodiment of a magnetic resonance tomography system.

FIG. 7 shows a schematic diagram of a magnetic resonance tomography (MRT) system 2 in accordance with an example of a form of embodiment. The MRT system 2 may have the LC 1. The MRT system 2 may also have a magnet unit 26, as well as a control facility 27 with a transmit and receive module 28.

In a patient tunnel 29 of the magnet unit 26, for example, the patient 22 lies on the patient couch 25. The LC 1 lies on the torso of the patient 22. The LC 1 may, for example, not have any connecting cable to LC-external devices. The LC 1 may, for example, be linked via a wireless connection to the control facility 27 (e.g., to the transmit and receive module 28), over which image and/or control signals may be transmitted. A wireless LC 1 needs a multiple increase in power compared to a wired LC, so that the power converted into heat is distributed by the heat sink body 3 of the present embodiments.

Overall, the present embodiments show a possibility for heat dissipation for wireless MRT local coils.

The elements and features recited in the appended claims may be combined in different ways to produce new claims that likewise fall within the scope of the present invention.

Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography system, the local coil having a local coil body that is plate-shaped with a main extension plane, the local coil comprising:
   an electronic apparatus within the local coil body; and
   a heat sink body that is electrically non-conducting, linked for conduction of heat to the electronic apparatus, and is configured as a type of plate within the local coil body, such that heat of the electronic apparatus is distributed in the main extension plane of the local coil body.

2. The local coil of claim 1, wherein the electronic apparatus is enclosed by the heat sink body.

3. The local coil of claim 1, wherein the electronic apparatus, viewed in the main extension plane, is arranged in a middle of the heat sink body.

4. The local coil of claim 3, wherein a height of the heat sink body at right angles to the main extension plane reduces from the middle outwards, and
   wherein the heat sink body is configured in a disk shape in the main extension plane.

5. The local coil of claim 1, further comprising a heat insulation layer that at least partly encloses the heat sink body.

6. The local coil of claim 5, wherein a thickness of the heat insulation layer at right angles to the main extension plane reduces from a middle of the heat sink body outwards.

7. The local coil of claim 1, wherein the heat sink body is thicker below the electronic apparatus than above the electronic apparatus.

8. The local coil of claim 1, wherein the heat sink body has a hinge that is configured to adjust an angle in the heat sink body.

9. The local coil of claim 8, wherein the hinge has a latching apparatus that is configured to fix the angle.

10. The local coil of claim 8, wherein the local coil body has at least two sections connected movably to one another, and
    wherein the heat sink body is configured to extend over the at least two sections.

11. The local coil of claim 1, wherein the heat sink body is deformable.

12. The local coil of claim 1, wherein the electronic apparatus comprises:
    a housing; and
    a circuit board with an electronic component within the housing.

13. The local coil of claim 12, wherein the housing is glued to the heat sink body.

14. The local coil of claim 12, wherein the housing is connected to the heat sink body by a clamp connection.

15. A magnetic resonance tomography system comprising:
 a local coil having a local coil body that is plate-shaped with a main extension plane, the local coil comprising:
  an electronic apparatus within the local coil body; and
  a heat sink body that is electrically non-conducting, linked for conduction of heat to the electronic apparatus, and is configured as a type of plate within the local coil body, such that heat of the electronic apparatus is distributed in the main extension plane of the local coil body.

16. The magnetic resonance tomography system of claim 15, wherein the electronic apparatus is enclosed by the heat sink body.

17. The magnetic resonance tomography system of claim 15, wherein the electronic apparatus, viewed in the main extension plane, is arranged in a middle of the heat sink body.

18. The magnetic resonance tomography system of claim 17, wherein a height of the heat sink body at right angles to the main extension plane reduces from the middle outwards, and
 wherein the heat sink body is configured in a disk shape in the main extension plane.

19. The magnetic resonance tomography system of claim 15, wherein the local coil further comprises a heat insulation layer that at least partly encloses the heat sink body.

* * * * *